SEMICONDUCTOR DEVICE CONTACT STRUCTURE

Filed March 1, 1965 2 Sheets-Sheet 1

INVENTORS
Joseph Marino and
William R. Schaefer
BY
Donald R. Lackey
ATTORNEY

Dec. 24, 1968 J. MARINO ET AL 3,418,543

SEMICONDUCTOR DEVICE CONTACT STRUCTURE

Filed March 1, 1965 2 Sheets-Sheet 2

United States Patent Office 3,418,543

Patented Dec. 24, 1968

3,418,543

SEMICONDUCTOR DEVICE CONTACT STRUCTURE

Joseph Marino, Irwin, and William R. Schaefer, Greensburg, Pa., assignors to Westinghouse Electric Corporation, Pittsburgh, Pa., a corporation of Pennsylvania Filed Mar. 1, 1965, Ser. No. 436,725
5 Claims. (Cl. 317—234)

This invention relates in general to semiconductor devices, and more particularly to junction-type transistors in which the connection to certain transistor elements is accomplished by compression bonding.

In the construction of junction-type transistors, the collector element is commonly formed on one surface of the semiconductor wafer or material, and the emitter and base elements are formed on the opposite surface. In order to provide a uniform bias and uniform current flow throughout the semiconductor material, the distances between the emitter, base and collector elements should be uniform. This is accomplished by forming the emitter and base elements in the form of a plurality of concentric rings, in which the emitter element is formed by connecting alternate rings, and the base element is formed by connecting the remaining rings, or intervening semiconductor material.

The semicoductor material, in the form of a wafer of N or P-type conductivity material, has the collector material disposed on one of its surfaces, and the emitter and base material in the form of a plurality of alternate concentric rings, disposed on its opposite surface. The emitter and collector materials are of a type that will change the semiconductor material to its opposite conductivity type. The assembly is heated in a vacuum furnace while being compressed in powdered graphite, which forms P-N or rectifying junctions at the alloyed interfaces formed between the emitter and semiconductor wafer, and between the collector and semiconductor wafer. The base material forms an ohmic contact with the semiconductor wafer. This construction provides uniform distances between the collector, emitter and base elements, uniform current flow throughout the semiconductor material, and also provides the desirable small current flow paths from the emitter to base elements.

After the alloyed P-N junctions are formed, connecting "bridges" or conductors between the emitter rings, connecting "bridges" between the base rings, and the emitter and base leads, are all disposed in contact with the appropriate rings, and this assembly is heated to remelt the rings and permanently secure the contacting bridges and leads thereto. This reheating operation, however, is the cause of considerable rejects and de-rating of the devices, as the ring material has a tendency to leach and collect around the leads and bridges. This leaching problem is aggravated by vibration, poor atmosphere in the brazing furnace, water vapor, unclean parts, or even parts that are too clean, making the operation very critical to control. Also, the joints produced between the leads, bridges, and element rings, are subject to vibration and thermal fatigue, which may adversely affect the useful life of the device.

Accordingly, it is an object of this invention to provide a new and improved semiconductor device.

Another object of the invention is to provide a new and improved semiconductor device in which the connections to the semiconductor elements are not adversely affected by vibration and thermal cycling.

A further object of the invention is to provide a new and improved junction transistor in which the connections to the transistor elements are not brazed or soldered.

Another object of the invention is to provide a new and improved junction transistor in which the connections to the transistor elements form more than a point contact with the elements.

Still another object of the invention is to provide a new and improved junction transistor in which the connections to the elements of the transistor are accomplished by pressure bonding.

Briefly, the present invention accomplishes the above cited objects by providing a junction transistor in which the emitter and base leads make contact with the emitter and base rings through first and second metallic members, respectively. The first and second metallic members each have a surface which has been machined to form semi-circular projections, which will contact the appropriate element rings disposed on the semiconductor wafer for substantially half of the total element area. The first and second members are disposed in insulated side-by-side relation upon the surface of the semiconductor wafer that contains the concentric rings, and aligned so that the projections on the first metallic member contact the emitter rings, and the projects on the second metallic member contact the base rings. Pressure means is used to apply a pressure to the surfaces of the first and second metallic members which are opposite their surfaces which contact the emitter and base rings, to form low resistance electrical connections or joints between the first and second metallic members and the transistor elements, without soldering or brazing, and to form joints which are not adversely affected by vibration and thermal fatigue.

Further objects and advantages of the invention will become apparent as the following description proceeds and features of novelty which characterize the invention will be pointed out in particularity in the claims annexed to and forming a part of this specification.

For a better understanding of the invention reference may be had to the accompanying drawings, in which.

Figure 1:
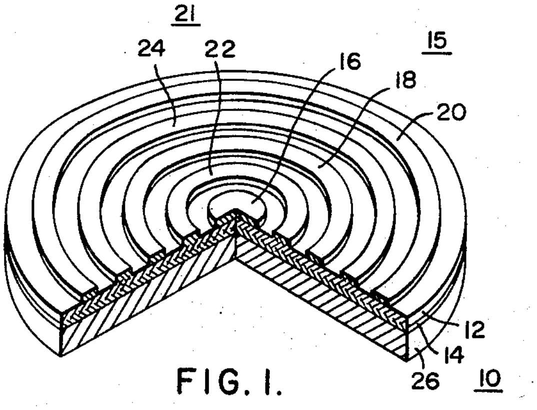
FIGURE 1 is a perspective view, partially in section, of a semiconductor transistor device.

Referring now to the drawings, and FIG. 1 in particular, there is illustrated a semiconductor device or transistor 10, containing a wafer of semiconductor material 12, such as silicon or germanium, that has been doped with conductivity impurities to produce a semiconductor having either P or N-type conductivity characteristics. The N-type semiconductor material has donor impurities, such as antimony, phosphorus, or arsenic, and they add excess electrons to the semiconductor material, resulting in current flow due to movement of electrons. The P-type semiconductor material may have acceptor impurities, such as gallium, aluminum, indium or boron, which absorb electrons, resulting in current flow due to movement of electron vacancies or holes within the material, which act like positive charges.

The collector element 14 of transistor 10 is formed of metallic foil, which contains impurities of a conductivity type opposite to those in the semiconductor wafer 12. Gold foil, because of its high conductivity and stability, has been found to be excellent, with impurities such as boron being added to form P-type semiconductor material, and impurities such as antimony being added to form N-type semiconductors. The bottom element 14, which is coextensive with the surface of wafer 12, is usually selected to be the collector element because of its relatively large size, enabling the heat developed due to high collector currents to be dissipated. It will be understood, however, that the invention will be equally applicable if the large element 14 were to be the emitter element.

The base element 15 is actually the unalloyed body portion of wafer 12, and may be formed in a plurality of sections, such as circular member 16 centrally disposed upon semiconductor wafer 12, and concentric ring members 18 and 20. The base element sections 16, 18 and 20 may also be formed of gold foil, but they do not contain impurities to change the conductivity type of the semiconductor wafer 12. The base sections 16, 18 and 20 are utilized merely to make good ohmic contact with the body of wafer 12.

The emitter element 21 is also formed in a plurality of sections, such as ring members 22 and 24. The emitter sections 22 and 24 are disposed to alternate with the base sections 16, 18 and 20 to form a succession of base-emitter sections and obtain the desired equi-distant relationship between the base 15, emitter 21 and collector 14, and also obtain the desired small current flow paths from the emitter element 21 to the base element 15. The emitter element sections 22 and 24 may also be formed of gold foil having impurities of a conductivity type opposite to those in the semiconductor wafer 12.

In forming transistor 10, the semiconductor wafer, the metallic foil for forming collector element 14, and the metallic foil for forming base sections 16, 18 and 20, and emitter sections 22 and 24, are placed in a container which contains powdered graphite, with the relative relationships of the elements 14, 15 and 21 with respect to wafer 12 being as shown in FIG. 1. The transistor assembly is completely surrounded with powdered graphite, compressed to obtain intimate contact between elements 14, 15 and 21 and wafer 12, and heated in a vacuum furnace to melt the metallic foil and obtain P-N or rectifying junctions between the collector element 14 and wafer 12, and between emitter sections 22 and 24 and wafer 12. The melted foil dissolves the adjacent portions of the semiconductor wafer 12, producing an alloy solution, which upon freezing produces a P-N junction at the boundary between the alloy portion and the semiconductor portion, if the foil contained impurities of an opposite conductivity type to that of the semiconductor wafer 12. Thus, in FIGURE 1, P-N junctions are produced between collector element 14 and semiconductor wafer 12, and between emitter sections 22 and 24 and semiconductor wafer 12. Ohmic or non-rectifying contacts are produced between base sections 16, 18 and 20, and wafer 12, as the base sections 16, 18 and 20 do not contain impurities of a conductivity type opposite to that of the wafer 12.

The structure of semiconductor device 10 is completed by attaching an electrode member 26 to the collector element 14, which has substantially the same coefficient of thermal expansion as the semiconductor wafer 12. Electrode member 26 may be formed of material such as molybdenum or tungsten, and may be gold plated to facilitate the brazing or joining of member 26 to collector element 14.

Semiconductor device 10 may then be lapped on its opposed major parallel surfaces, to make the exposed surface of electrode member 26, and the exposed surface of semiconductor wafer 12 which has the emitter and base elements 21 and 15 disposed thereon, flat and parallel. The lapping operation may be followed with a slight etch, and then the semiconductor device 10 is cleaned and dried.

The semiconductor device or transistor 10 is completed at this point, and is ready for assembly or encapsulation. It may also be electrically tested at this point, with assurance that its characteristics will not be changed, as the device 10 will not be subjected to further heating operations, as are devices of the prior art.

In prior art devices, it is common for electrode member 26 to be soldered to a metallic mounting or electrode member, such as copper, and the wafer 12, with its alloyed elements 14, 15 and 21, is disposed with its collector element 14 against the electrode member 26. Then, a bridging conductor must be placed to connect the base sections 16, 18 and 20 together, a bridging conductor must be placed to connect emitter sections 22 and 24 together, and emitter and base leads must be appropriately placed. This structure is then hydrogen brazed to attach the collector element 14 to electrode member 26 and the bridge and lead conductors to the appropriate rings. It is this operation, along with the point contact bridging and lead conductors that is eliminated by following the teachings of this invention. Thus, leaching of the base and emitter sections and attrition of the metal which make up the ring sections to the bridging and lead members, is completely eliminated.

Excellent electrical and thermal contact may be made to electrodes close to semiconductor materials by utilizing pressure and soft metals having high electrical conductivity, such as gold. Brazing, with its deleterious effects due to the elevated temperatures and flux is completely eliminated. Further, the pressure bonded joint produced has very low resistance, and is not subject to failure due to thermal fatigue, as is a soldered or brazed joint. This pressure bonding technique is utilized to provide the electrical connections to the emitter, base, and collector elements, 21, 15 and 14, respectively.

Figure 2:
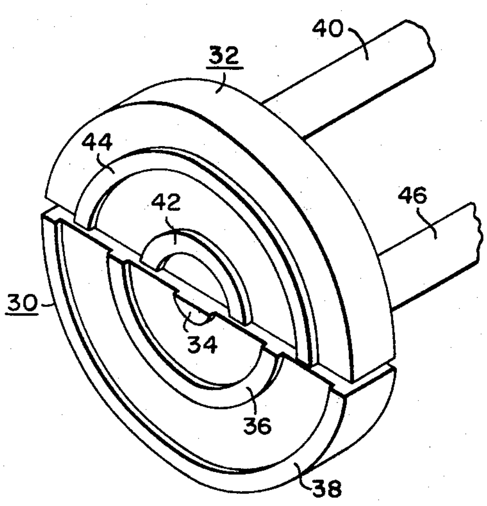
FIG. 2 is a perspective view of two contact members or electrodes constructed according to the teachings of this invention.

FIGURE 2 is a perspective view of two contact members or electrodes 30 and 32, which may be used to provide the pressure connections with the base and emitter elements 15 and 21, respectively. In general, each pressure contact member 30 and 32 may be formed of a material having good electrical conductivity, such as copper, and may be gold plated to prevent oxide formation and insure that the physical contact between members 30 and 32 and elements 15 and 21 will produce low resistance electrical joints. Each contact member 30 and 32 is in the form of a semicircle, such that when their diameters are placed in close insulated relationship, a circular member is formed which has a slightly smaller diameter than the semiconductor device 10, shown in FIG. 1. The major opposed or parallel surfaces of pressure contact members 30 and 32 have raised projections on one side thereof, and electrical leads attached to their opposite surfaces.

More specifically, contact member 30 has raised projections 34, 36 and 38 thereon, which are formed to coincide with base element sections 16, 18 and 20, respectively. A relatively heavy electrical lead 40 is attached to the opposed surface of contact member 30, such as by brazing, or by threading the end of the lead 40 and forming mating threads in an opening in member 30 for receiving the threaded end of lead 40.

Contact member 32 has raised projections 42 and 44, thereon, which are formed to coincide with the emitter element sections 22 and 24, respectively. A relatively heavy electrical lead 46 is attached to the opposed surface of contact member 32. Thus, when contact members 30 and 32 are disposed upon the upper surface of semiconductor device 10, as shown in FIG. 1, to form a complete circle with a thin insulating member disposed between them, the raised or projecting portions 34, 36 and 38 of contact member 30 will contact the base sections 16, 18 and 20, and the projecting portions 42 and 44 of contact member 32 will contact the emitter sections 22 and 24. It will be noted that the desired joints or contacts will be made regardless of the angular alignment of contact members 30 and 32 once the circular member formed by the adjacent contact members 30 and 32 has its central axis aligned with the axis of semiconductor device 10. It will also be noted that instead of making point contact with the elements, each contact member 30 and 32 will contact substantially 50% of its associated element area. The bridging or connection of like electrode sections takes place automatically through the conductive body portions of contact members 30 and 32, and the smooth flat surfaces or faces of contact members 30 and 32 which are opposed to their faces which contain the raised projections, lend themselves to the uniform application of pressure by pressure producing means, which will be hereinafter described.

Figure 3:
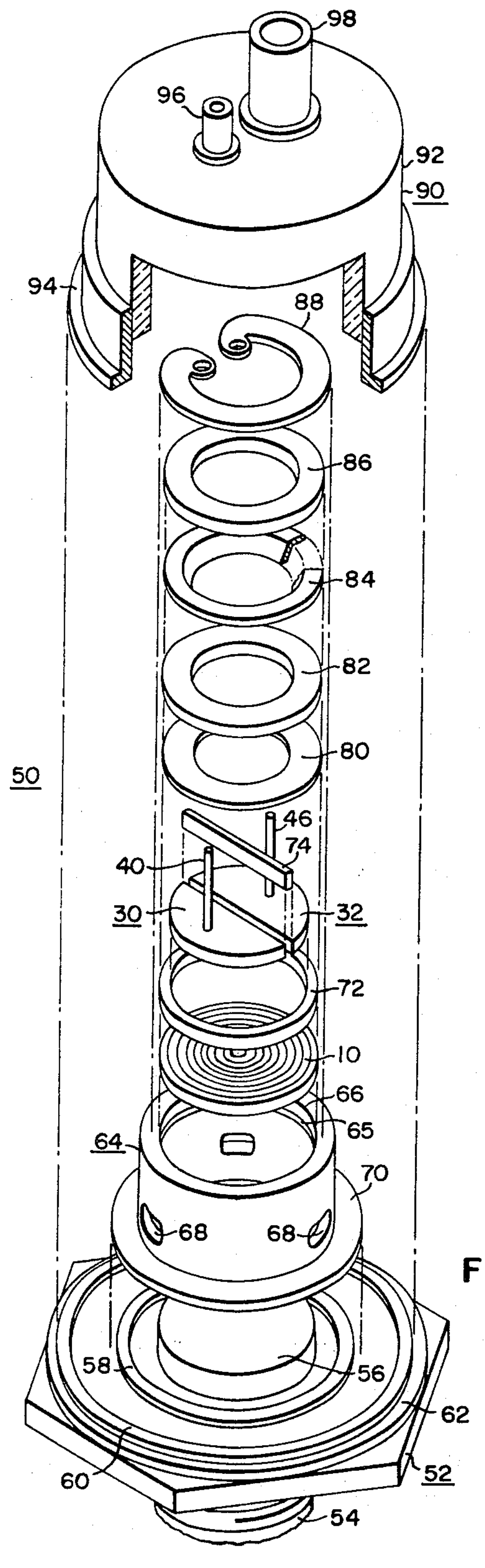
FIG. 3 is an exploded perspective view showing a semiconductor device constructed according to the teachings of this invention.
Figure 4:
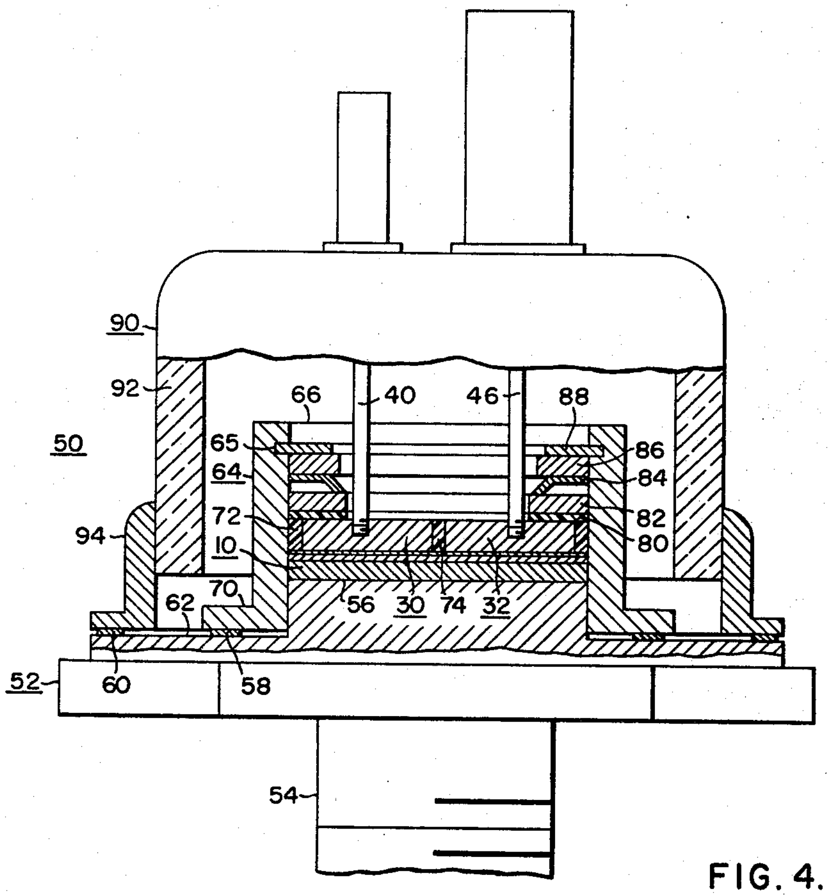
FIG. 4 is an elevational view, in section, showing the device of FIG. 3 completely assembled.

FIGS. 3 and 4 illustrate exploded and assembled views, respectively, of a complete encapsulated semiconductor device 50, constructed according to the teachings of this invention. FIG. 3 is an exploded perspective view, and FIG. 4 is an elevational view, in section, of the assembled device 50. Both FIGS. 3 and 4 will be referred to in the following description.

The device 50 includes a metallic mounting member 52, which forms the collector lead or electrode of the device. The mounting member 52, which is formed of a metallic material having high electrical and thermal conductivity characteristics, such as copper, has a threaded depending portion 54 which may be used to connect the device 50 to an external heat sink, and also connect the collector element 14, shown in FIG. 1, to an external electrical circuit. Mounting member 52 has a projecting circular portion 56 which may be gold plated and lapped to obtain a flat, highly conductive surface. Steel rings 58 and 60 are suitably secured to surface 62 of mounting member 52, concentric with the axis of mounting member 52, for purposes that will be hereinafter described.

An inner housing member 64, which may be constructed of any suitable material, such as steel, has a tubular shape with side wall portions defining a central axial opening 66 extending between its ends, transverse openings 68, and a flanged portion 70 disposed near one of its ends. The flanged end of inner housing 64 is disposed over projecting portion 56 of mounting member 52, with the flanged portion 70 disposed to contact steel ring 58. The inner housing 64 may be secured to mounting member 52 by projection welding the flange 70 to steel ring 58.

The semiconductor device 10, shown in detail in FIG. 1, is disposed within the internal opening 66 of inner housing 64, with the lapped gold outer surface of collector electrode 26 being disposed against the lapped gold surface of projecting portion 56 of mounting member 52, as best shown in FIG. 4. The two mating gold plated surfaces, on semiconductor device 10 and on projecting portion 56, form a low resistance electrical joint when pressure bonded which makes mounting member 52 electrically an extension of the collector element 14.

A thin walled, tubular member 72, formed of an electrical insulating material such as Micarta, is inserted into the opening 66 of inner housing 64. Member 72 has an external diameter slightly smaller than the internal diameter of opening 66 of inner housing 64 and substantially the same as the diameter of semiconductor device 10, which allows it to be inserted into the opening 66 of inner housing 64 in close fitting relation therewith, and rest upon the outer portion of device 10.

Contact members or electrodes 30 and 32, hereinbefore described and shown in detail in FIG. 2, are disposed within opening 66 of inner housing 64, and have a diameter when assembled to form a circular shape which allows them to enter the opening in insulating member 72 in a close fitting manner. Insulating member 74 is disposed between pressure contact members 30 and 32 to prevent them from electrically contacting one another. When contact members 30 and 32 are disposed to contact the upper surface of semiconductor device 10, as shown in FIG. 4, their projecting portions will be automatically aligned with the base and emitter element sections, respectively. Thus, electrical lead 40 forms the base lead, and electrical lead 46 forms the emitter lead.

A thin washer shaped member 80, formed of an electrical insulating material, such as Mica, is disposed in the opening 66 to cover the outer upper surface of contact members 30 and 32. A metallic washer member 82, having a diameter which allows it to be disposed within opening 66 in a close fitting manner, is disposed over insulating washer member 80. Pressure producing means 84, which may be formed of spring steel, or other suitable material, is disposed within opening 66. Pressure producing means 84 may be a spring designed to produce very high pressure upon the member that its lower depending portion is in contact with, when its upper portion is subjected to a compressive force. A metallic washer 86, similar to washer 82, is placed in opening 66, in contact with the upper portion of pressure producing means 84. A snap ring 88, having an unstressed diameter larger than the diameter of opening 66, is compressed to form a diameter that will allow it to enter opening 66. The snap ring 88 and contacting members are pressed downward, causing the spring or pressure means 84 to shorten its axial length, until snap ring 88 snaps into the groove 65 disposed on the wall of opening 66. The snap ring 88 thus keeps spring or pressure producing means 84 compressed, which places high pressure upon the whole axially aligned assembly, including contact members 30 and 32 and the upper surface of semiconductor device 10, and the lower surface of semiconductor device 10 and the surface of projecting portion 56 of mounting member 52. The joints formed between semiconductor device 10 and its contacting electrode have relatively soft gold on each of the contacting surfaces, producing low resistance electrical joints not subject to failure due to thermal cycling. The contacting electrodes 30, 32 and 56 are all of a substantial size, not subject to breakage due to vibration, and they will also carry heat quickly away from the semiconductor device 10.

After the snap ring 88 is pressed into position, the whole assembly within inner housing 64 may be sprayed with means, such as silicone varnish, for reducing the surface activity of the parts. Openings 68 in the wall portions of inner housing 64 allow access to the assembly for this purpose.

Inner housing 64 is thus a holding and aligning means which axially aligns the various components of assembly 50 and provides means for snap ring 88 to produce a compressive force on spring member 84.

An outer housing 90, having an opening at one end thereof, may then be disposed over inner housing 64 and attached to the mounting member 52. The outer housing 90 includes a ceramic or insulating portion 92, a metallic flanged portion 94 which is suitably attached to insulating portion 92, and leads 96 and 98, which extend through the insulating portion 92.

The final assembly of outer housing 90 takes place in a dry atmosphere, in which the outer housing 90 is disposed concentrically over inner housing 64, with the flange portion 94 resting upon outer steel ring 60 of mounting member 52, and leads 40 and 46 extending into internal openings in leads 96 and 98. The flanged portion 94 may then be projection welded to steel ring 60, and the leads 40 and 46 are suitably attached to leads 96 and 98. A dessicant may be placed within the enclosed assembly before the outer housing is secured, if desired.

Thus, a complete semiconductor device 50 is constructed which completely eliminates the leaching problem present in prior art devices, because the electrodes which contact the elements of semiconductor device 10 are not brazed thereto. In fact, in solving the leaching problem, a more reliable device has been created for other reasons, such as the elimination of solder joints with their higher resistance and heat producing qualities. Also, there is no danger of solder failure between electrodes and elements due to thermal fatigue. Thermal cycling actually improves a pressure bonded joint.

The assembly of the device 50 has also been greatly simplified, as intricate placement of small delicate bridging members and leads has been eliminated. Also, manufacturing tolerances may be relaxed without sacrificing reliability or performance of the device.

The useful life of the device 50 has been lengthened due to the fact that the device 10 is cooled from both sides instead of from one side, as is the custom in prior art devices. The large contacting members 30 and 32, with their greater contacting areas on the surface of device 10 withdraws heat rapidly from the P-N junctions. Also, a device 50 is produced which allows the semiconductor device 10 to be checked and tested before final assembly, without any further heating operations which may be deleterious to the semiconductor material.

The device 50 is also more reliable if used on applications where vibrations are present, as there are no flexible leads and bridging members to fatigue and break. All of the components are rugged, and not susceptive to fatigue failure.

Since numerous changes may be made in the above-described apparatus and different embodiments of the invention may be made without departing from the spirit thereof, it is intended that all matter contained in the foregoing description or shown in the accompanying drawings shall be interpreted as illustrative and not in a limiting sense.

We claim as our invention:

1. A semiconductor device comprising a wafer of semiconductor material of a first type conductivity having first and second parallel major surfaces; said wafer forming a first semiconductor element; a second semiconductor element comprising a zone of a second type conductivity material disposed upon the first major surface of said wafer; a third semiconductor element comprising a plurality of spaced zones of second type conductivity material disposed upon the second major surface of said semiconductor wafer; the interfaces between said second and first elements and between said third and first elements forming rectifying junctions; a mounting member having a substantially flat surface thereon; said wafer of semiconductor material being disposed upon the substantially flat surface of said mounting member, with said second element being in contact therewith; first and second contact members each having a plurality of spaced projections thereon; said first and second contact members being disposed upon the second major surface of said semiconductor wafer, with the spaced projections of said first contact member being in contact with at least a portion of the spaced zones of said third semiconductor element, and the spaced projections of said second contact member being in contact with said first semiconductor element; and means applying pressure to said first and second contact members to form pressure bonded joints between said first contact member and said third semiconductor element, between said second contact member and said first semiconductor element, and between said mounting member and said second semiconductor element.

2. A semiconductor device comprising a wafer of semiconductor material of a first type conductivity having first and second substantially flat, parallel major surfaces; said wafer forming a first semiconductor element; a second semiconductor element comprising a zone of a second type conductivity material disposed upon and coextensive with the first major surface of said wafer; a third semiconductor element comprising a plurality of spaced zones of second type conductivity material disposed upon the second major surface of said wafer; the interfaces between said second and first elements and between said third and first elements forming rectifying junctions; a mounting member having a substantially flat surface thereon; a first housing member having wall portions which define an opening which extends therethrough; said first housing member being secured to said mounting member with its opening allowing access to the substantially flat portion of said mounting member; said wafer of semiconductor material being disposed within said housing member with its second element in contact with the flat surface of said mounting member; first and second contact members each having a plurality of spaced projections thereon; said first and second contact members being disposed within said housing member with the spaced projections upon said first contact member being in contact with at least a portion of the spaced zones of said third semiconductor element, and the spaced projections of said second contact member being in contact with at least a portion of said first semiconductor element; means cooperating with said first housing member to apply pressure to said first and second contact members and form pressure bonded joints between said first contact member and said third semiconductor element, between said second contact member and said first semiconductor element, and between said mounting member and said second semiconductor element; and, a second housing member secured to said mounting means and enclosing said first housing member.

3. A semiconductor device comprising a wafer of semiconductor material of a first type conductivity having first and second substantially flat, parallel major surfaces; said wafer forming a first semiconductor element; a second semiconductor element comprising a zone of second type conductivity material disposed upon the first major surface of said wafer; a third semiconductor element comprising a plurality of circular, concentric, spaced zones of second type conductivity material disposed upon the second major surface of said semiconductor wafer; the interfaces between said second and first elements and between said third and first elements forming rectifying junctions; a mounting member having a substantially flat surface thereon; a tubular member having a central opening which extends between its ends; said tubular member being secured to said mounting member with one of its open ends being disposed against the flat surface of said mounting member; said wafer of semiconductor material being disposed within said tubular member with its second element in contact with the flat surface of said mounting member; first and second contact members each being semi-circular in shape and having first and second parallel major surfaces; the first major surface of each of said first and second contact members having spaced projections thereon; the second major surface of each of said first and second contact members having an electrical lead extending therefrom; said first and second contact member being disposed in insulated side-by-side relation within said tubular member, with the spaced projections of said first contact member being in contact with the spaced zones of said third semiconductor element, and the spaced projections on said second contact member being in contact with the first semiconductor element, and means applying a predetermined pressure to the second major surface of said first and second contact members to form pressure bonded joints between said first contact member and said third semiconductor element, between said second contact member and said first semiconductor element, and between said mounting member and said second semiconductor element.

4. A semiconductor transistor comprising a wafer of semiconductor material of a first type conductivity having first and second substantially flat, parallel major surfaces; said wafer forming a first element of said transistor; a second element of said transistor comprising a zone of second type conductivity material disposed upon the first major surface of said wafer and forming a P-N junction at the interface; a third element of said transistor comprising a plurality of circular concentric spaced zones of a second type conductivity material disposed upon the second major surface of said wafer and forming P-N junctions at the interfaces; a metallic mounting member having a substantially flat surface thereon; a tubular member having a central opening which extends between its ends; said tubular member being secured to said mounting member with one of its open ends being disposed against the flat surface of said mounting member; said wafer of semiconductor material being disposed coaxially within said tubular member with its second element disposed in contact with the flat surface of said mounting member; first and second metallic contact members each being substantially semi-circular in shape and having first and second parallel major surfaces; the first major surface of each of said first and second metallic contact members having spaced concentric semi-circular projections thereon; the second major surface of each of said first and second contact members having an electrical lead extending therefrom; said first and second contact members being disposed in insulated side-by-side relation within said tubular member, with the spaced projections on said first contact member contacting at least a portion of the spaced zones of said third semiconductor element, and the spaced projections on said second contact member contacting at least a portion of the area of the intervening first semiconductor element; and means including a spring cooperating with said tubular member to apply a predetermined pressure to the second major surfaces of said first and second contact members, to form pressure bonded joints between said first contact member and said third semiconductor element, between said contact member and said first semiconductor element, and between said mounting member and said second semiconductor element.

5. A semiconductor transistor comprising a wafer of semiconductor material of a first conductivity type having first and second substantially flat parallel major surfaces; said wafer forming a first element of said transistor; a second element of said transistor comprising a zone of second type conductivity material disposed upon the first major surface of said wafer and forming a P-N junction at the interface; a third element of said transistor comprising a plurality of circular concentric spaced zones of a second type conductivity material disposed upon the second major surface of said wafer and forming P-N junctions at the interfaces; a plurality of concentric spaced zones of a material having the same type conductivity of said first element disposed upon the second major surface of said wafer and intervening the spaced zones of said third element to form ohmic contacts with said first element; a metallic mounting member having a substantially flat surface thereon; a tubular member having a central opening which extends between its ends; said tubular member being secured to said mounting member with one of its open ends being disposed against the flat surface of said mounting member; said wafer of semiconductor material being disposed coaxially within said tubular member with its second element disposed in contact with the flat surface of said mounting member; first and second metallic contact members each being substantially semi-circular in shape and having first and second parallel major surfaces; the first major surface of each of said first and second metallic contact members having spaced concentric semi-circular projections thereon, the second major surface of each of said first and second contact members having an electrical lead extending therefrom; said first and second contact members being disposed in insulated side-by-side relation within said tubular member, with the spaced projections of said first contact member contacting substantially one half of the area of the spaced zones of said third semiconductor element, and the spaced projections on said second contact member contacting substantially one half of the area of the intervening ohmic contacts on said first semiconductor element; means including a spring cooperating with the tubular member to apply a predetermined pressure to the second major surface of said first and second contact members to form pressure bonded joints between said first contact member and said third semiconductor element, between said second contact member and said first semiconductor element, and between said mounting member and said second semiconductor element; and means encapsulating said tubular member and semiconductor wafer; said encapsulating means having electrical leads extending therefrom which are connected to the leads which extend from said first and second contact members.

References Cited

UNITED STATES PATENTS

| | | | |
|---|---|---|---|
| 2,849,665 | 8/1958 | Boyer et al. | 317—235 |
| 2,937,960 | 5/1960 | Pankove | 148—1.5 |
| 3,122,680 | 2/1964 | Benn et al. | 317—101 |
| 3,124,640 | 3/1964 | Armstrong | 174—72 |
| 3,349,296 | 10/1967 | Patalong | 317—234 |

JOHN W. HUCKERT, *Primary Examiner.*

R. F. SANDLER, *Assistant Examiner.*